United States Patent
Basler et al.

(10) Patent No.: US 9,660,029 B2
(45) Date of Patent: May 23, 2017

(54) SEMICONDUCTOR DEVICE HAVING A POSITIVE TEMPERATURE COEFFICIENT STRUCTURE

(71) Applicant: Infineon Technologies Austria AG, Villach (AT)

(72) Inventors: Thomas Basler, Riemerling (DE); Hans-Joachim Schulze, Taufkirchen (DE); Johannes Georg Laven, Taufkirchen (DE); Joachim Mahler, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/942,389

(22) Filed: Nov. 16, 2015

(65) Prior Publication Data
US 2016/0155796 A1    Jun. 2, 2016

(30) Foreign Application Priority Data
Nov. 17, 2014    (DE) .................. 10 2014 116 759

(51) Int. Cl.
*H01L 29/66*    (2006.01)
*H01L 29/08*    (2006.01)
(Continued)

(52) U.S. Cl.
CPC ........ *H01L 29/0821* (2013.01); *H01L 29/452* (2013.01); *H01L 29/456* (2013.01);
(Continued)

(58) Field of Classification Search
CPC ............ H01L 29/0696; H01L 29/1095; H01L 29/66325–29/66712; H01L 29/7393–29/7398; H01L 2924/13055
See application file for complete search history.

(56) References Cited

U.S. PATENT DOCUMENTS

2008/0265326 A1    10/2008   Hebert
2014/0021508 A1*    1/2014   Sheu ................. H01L 31/02016
                                                                257/113
(Continued)

FOREIGN PATENT DOCUMENTS

DE    102014100522 A1    7/2014
DE    102014104061 A1    10/2014
WO    2014125318 A1    8/2014

*Primary Examiner* — Cuong B Nguyen
(74) *Attorney, Agent, or Firm* — Murphy, Bilak & Homiller, PLLC (57) ABSTRACT

A semiconductor device includes a first load terminal at a first surface of a semiconductor body and a second load terminal at the opposing surface. An active device area is surrounded by an edge termination area. Load terminal contacts are absent in the edge termination area and are electrically connected to the semiconductor body in the active device area at the first surface. A positive temperature coefficient structure is between at least one of the first and second load terminals and a corresponding one of the first and second surfaces. Above a maximum operation temperature specified for the semiconductor device, a specific resistance of the positive temperature coefficient structure increases by at least two orders of magnitude within a temperature range of at most 50 K. A degree of area coverage of the positive temperature coefficient structure is greater in the edge termination area than in the active device area.

20 Claims, 6 Drawing Sheets

(51) Int. Cl.
    *H01L 29/861*     (2006.01)
    *H01L 29/739*     (2006.01)
    *H01L 29/45*     (2006.01)
    H01L 29/06     (2006.01)
    H01L 29/16     (2006.01)
    H01L 29/20     (2006.01)

(52) U.S. Cl.
    CPC ........ *H01L 29/7393* (2013.01); *H01L 29/861* (2013.01); *H01L 29/8611* (2013.01); H01L 29/0619 (2013.01); H01L 29/0661 (2013.01); H01L 29/1608 (2013.01); H01L 29/2003 (2013.01)

(56) References Cited

U.S. PATENT DOCUMENTS

2014/0209852 A1     7/2014   Schulze et al.
2014/0291724 A1   10/2014   Voss et al.
2015/0236142 A1*   8/2015   Laven ................ H01L 21/2254
                                            257/66

\* cited by examiner

SEMICONDUCTOR DEVICE HAVING A POSITIVE TEMPERATURE COEFFICIENT STRUCTURE

PRIORITY CLAIM

This application claims priority to German Patent Application No. 10 2014 116 759.7 filed on 17 Nov. 2014, the content of said application incorporated herein by reference in its entirety.

BACKGROUND

In semiconductor power applications, for example power diode or power transistor applications, overcurrents or surge currents may occur, for example caused by low-inductive intermediate short-circuits. Intermediate short-circuits may be caused by driving disturbances, semiconductor failure, or short-circuits of loads, for example. Typically, a maximum overcurrent strength is specified in data sheets of semiconductor power devices as a maximum surge current rating. The maximum surge current rating depends on the energy input of the overcurrent, i.e. pulse duration, amount of peak current and voltage drop over the device. Semiconductor switches such as insulated gate bipolar transistors (IGBTs), insulated gate field effect transistors (IGFETs) such as metal oxide semiconductor field effect transistors (MOSFETs) or bipolar junction transistors may actively limit short-circuit currents for protecting the overall application and peripheral devices against damage. Avoiding damage of the semiconductor switches requires a fast turn-off in short-circuit mode because of high electrical losses in the semiconductor due to the applied full intermediate voltage.

It is desirable to provide a semiconductor device having an improved overcurrent strength or surge current strength.

SUMMARY

According to an embodiment of a semiconductor device, the semiconductor device comprises a first load terminal at a first surface of a semiconductor body and a second load terminal at a second surface of the semiconductor body opposite to the first surface. An active device area is surrounded by an edge termination area. Load terminal contacts are electrically connected to the semiconductor body in the active device area at the first surface. The semiconductor device further includes a positive temperature coefficient structure between at least one of the first and second load terminals and a corresponding one of the first and second surfaces. Above a maximum operation temperature specified for the semiconductor device a specific resistance of the positive temperature coefficient structure increases by at least two orders of magnitude within a temperature range of at most 50 K. A degree of area coverage with the positive temperature coefficient structure is greater in the edge termination area than in the active device area.

According to an embodiment of an insulated gate bipolar transistor, the insulated gate bipolar transistor comprises an emitter terminal at a first surface of a semiconductor body and a collector terminal at a second surface of the semiconductor body. A drift zone of a first conductivity type is in the semiconductor body between the first and second surfaces. A collector injection structure is between the drift zone and the second surface in a transistor cell area. A positive temperature coefficient structure is part of an emitter contact structure at the first surface. Above a maximum operation temperature specified for the semiconductor device a specific resistance of the positive temperature coefficient structure increases by at least two orders of magnitude within a temperature range of at most 50 K.

According to another embodiment of an insulated gate bipolar transistor, the insulated gate bipolar transistor comprises an emitter terminal at a first surface of a semiconductor body and a collector terminal at a second surface of the semiconductor body. An active device area is surrounded by an edge termination area. Emitter contacts are electrically connected to the semiconductor body in the active device area at the first surface. The insulated gate bipolar transistor further comprises a positive temperature coefficient structure between the collector terminal and a collector injection structure at the second surface. Above a maximum operation temperature specified for the semiconductor device a specific resistance of the positive temperature coefficient structure increases by at least two orders of magnitude within a temperature range of at most 50 K. The positive temperature coefficient structure at least partly covers the active device area at the second surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Figure 1A:
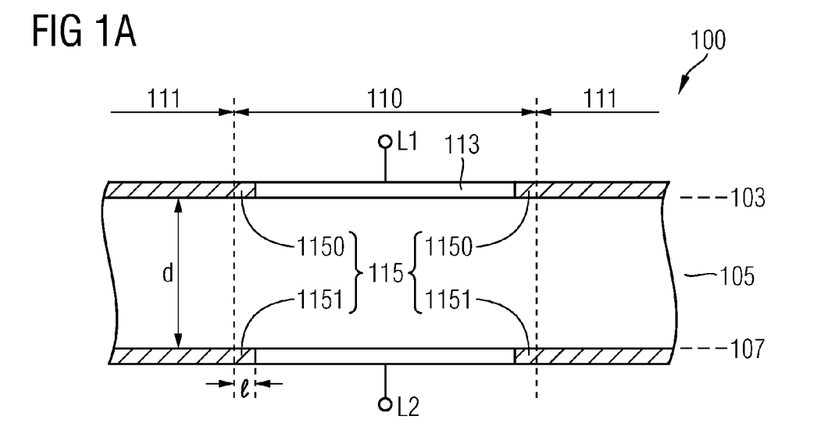
FIG. 1A is a schematic cross-sectional view illustrating a semiconductor device including a positive temperature coefficient structure.

An embodiment of a semiconductor device 100 is illustrated in the schematic cross-sectional view of FIG. 1A.

The semiconductor device 100 includes a first load terminal L1 at a first surface 103 of a semiconductor body 105. A second load terminal L2 is at a second surface 107 of the semiconductor body 105 opposite to the first surface 103. An active device area 110 is surrounded by an edge termination area 111. Load terminal contacts 113 are electrically connected to the semiconductor body 105 in the active device area 110 at the first surface 103. The semiconductor device 100 further comprises a positive temperature coefficient structure 115 between at least one of the first and second load terminals L1, L2 and a corresponding one of the first and second surfaces 103, 107. Above a maximum operation temperature specified for the semiconductor device a specific resistance of the positive temperature coefficient structure increases by at least two orders of magnitude within a temperature range of at most 50 K. According to embodiments, the maximum operation temperature or maximum junction temperature is 125° C., or 150° C., or 175° C.

Figure 1B:
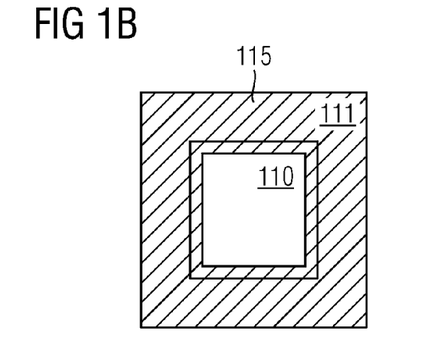
FIGS. 1B to 1E are schematic top views illustrating different layouts of the positive temperature coefficient structure.

A degree of area coverage with the positive temperature coefficient structure 115 is greater in the edge termination area 111 than in the active device area 110 which is exemplified in the top view of FIG. 1B for the specific case of full area coverage of the edge termination area 111 with the positive temperature coefficient structure 115 and partial coverage of the active device area 110 with the positive temperature coefficient structure 115. It is to be noted that the schematic illustration of FIG. 1B is merely one specific example of adjusting an area coverage with the positive temperature coefficient structure 115 in the edge termination area 111 greater than in the active device area 110. Other embodiments include different layouts for fulfilling the above relation between the area coverage with the positive temperature coefficient structure 115 in the edge termination area 111 and in the active device area 110. According to an embodiment, a diode includes the positive temperature coefficient structure 115 either on a surface of the anode or on a surface of the cathode. According to another embodiment, an IGBT includes the positive temperature coefficient structure 115 on a surface of the collector.

According to an embodiment, the positive temperature coefficient structure 115 covers less than 5%, or 10%, or 20% of the active device area 110.

According to another embodiment, the positive temperature coefficient structure 115 covers more than 50%, or 60%, or 70% of the edge termination area 111.

According to an embodiment, a lateral extension 1 of the positive temperature coefficient structure 115 from a transition between the edge termination area 111 and the active device area 110 into the active device area 110 is in a range of $0.12 \times d <= 1 <= 3 \times d$, or in a range of $0.32 \times d <= 1 <= 2 \times d$, or in a range of $0.52 \times d <= 1 <= d$, d being a thickness of the semiconductor body 105.

According to one embodiment, the positive temperature coefficient structure 115 includes one or more separate, continuous parts and each one of the continuous parts may include none, one or more vias or apertures.

By way of example, the positive temperature coefficient structure 115 illustrated in the top view of FIG. 1B may be considered as one continuous positive temperature coefficient structure having one via or aperture in the center of the active device area 110.

Figure 1C:
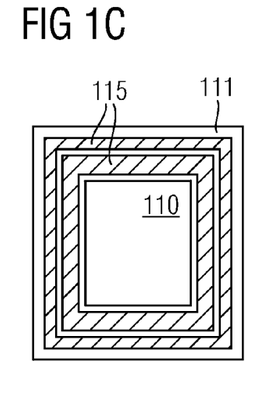
Figure 1D:
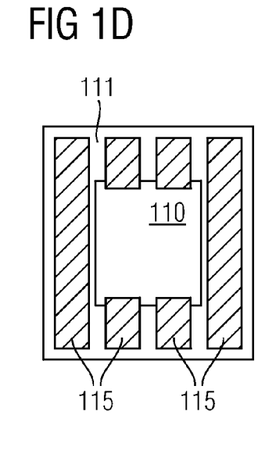
Figure 1E:
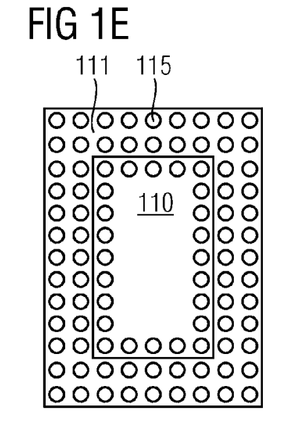

Further exemplary embodiments of layouts of the positive temperature coefficient structure 115 are illustrated in the top view of FIG. 1C for ring-shaped parts. The schematic top view of FIG. 1D illustrates stripe-shaped parts of the positive temperature coefficient structure 115 and the schematic top view of FIG. 1E illustrates a pattern of separate islands of the positive temperature coefficient structure 115. The islands of the positive temperature coefficient structure 115 illustrated in FIG. 1E are circular and may have equal or different dimensions. According to other embodiments, the islands have different shape, shapes such as, for example polygons, triangles, squares and circles and any combination thereof. A combination of any number and shape of parts of the positive temperature coefficient structure 115 may be used provided that the area coverage with the positive temperature coefficient structure 115 is greater in the edge termination area 111 than in the active device area 110.

According to an embodiment, the positive temperature coefficient structure is made of one of a first part 1150 between the first load terminal L1 and the first surface 103 and a second part 1151 between the second load terminal L2 and the second surface 107.

In the semiconductor body 105 a plurality of functional semiconductor regions are formed dependent on the type of semiconductor device.

According to an embodiment, the semiconductor device 100 is a diode including an anode region in the active device area 110 at the first surface 103 and a cathode region at the second surface 107. The first load terminal L1 is electrically connected to the anode region and the second load terminal L2 is electrically connected to the cathode region.

According to another embodiment, the semiconductor device 100 is an insulated gate bipolar transistor (IGBT) including an emitter at the first surface 103 and a collector at the second surface 107. The first load terminal L1 is electrically connected to the emitter and the second load terminal L2 is electrically connected to the collector.

The purpose of the edge termination area 111 is the reduction of electric field peaks at the periphery of the semiconductor device 100.

According to an embodiment, the edge termination area 111 includes a planar edge termination structure. Examples of planar edge termination structures are field plates, ring structures such as floating guard rings or ring segments, junction termination extension (JTE) structures and variation of lateral doping (VLD) structures. In case of a planar edge termination structure at the first surface 103, contacts on the semiconductor body 105 at the first surface 103 electrically connecting the semiconductor body 105 to the first load terminal L1 are limited to the active device area 110 and are absent in the edge termination area 111. In case of a diode, contacts electrically connecting the anode region at the first surface 103 to the load terminal L1 are limited to the active device area 110 and are absent in the edge termination area 111. In case of an IGBT, contacts electrically connecting the source region at the first surface 103 to the first load terminal L1 are limited to the active device area 110 and are absent in the edge termination area 111.

According to another embodiment, the edge termination area 111 includes a mesa edge termination structure. The mesa edge termination structure may include a multiple junction termination extension (MJTE) or bevel edge terminations such as a positive bevel edge termination structure or a negative bevel edge termination structure, for example.

The arrangement of the positive temperature coefficient structure 115 illustrated in FIGS. 1A to 1E allows for an improved overcurrent strength of the semiconductor device 100 due to an optimized edge termination. In a normal operation mode, temperatures in the edge termination area 111 are too low for causing a substantial increase of resistance of the positive temperature coefficient structure 115. Hence, current injection from the edge termination area 111 may occur unhindered. When the temperature exceeds a critical temperature, for example due to heating caused by overcurrent, the resistance of the positive temperature coefficient structure 115 substantially increases. As a result, current injection from the edge termination area 111 into the semiconductor body 105, for example into a drift zone of the semiconductor device 100 in the active device area 110 is hindered, and thus reduced. In case of a diode, current crowding in a boundary area of the anode caused by current injection from the cathode in the edge termination area 111 may be reduced. Likewise, current crowding in a boundary area of an emitter of an IGBT caused by a collector current injection from the edge termination area 111 may be reduced. Since current crowding in a boundary area of an emitter of an IGBT or in a boundary area of an anode of a diode may be a destructive or device damaging event caused by overcurrent, the semiconductor device 100 exhibits improved overcurrent strength.

According to an embodiment, the positive temperature coefficient structure 115 includes a material of at least one of a phase change material having a critical temperature of a phase change between a crystalline phase and an amorphous phase of greater than 175° C., a semiconducting, polycrystalline ceramic, polymer matrix-metal particles composites, and a polymer coated with carbon or with electrically conductive particles.

Examples of phase change materials are chalcogenides, for example $Ge_2Sb_2Te_5$.

In positive temperature coefficient structures made of semiconducting, polycrystalline ceramics, a boundary layer typically builds up at grain boundaries leading to an increase of resistance at a characteristic temperature, for example in a range between 80° C. and 130° C. An example of a semiconducting, polycrystalline ceramic is $BaTiO_3$.

According to another embodiment, positive temperature coefficient structures made of polymer matrix-metal particles composites may include 15 to 25 percentage by volume (vol %) of conducting metal particles having a length or diameter in a range of 15 nm and 5 µm. Depending on a force/pressure on the metal particles caused by the polymer matrix the conductivity of the polymer matrix-metal particles composites may vary. A phase transition between a crystalline phase and an amorphous phase or between an amorphous phase and a viscoelastic phase of the polymer matrix may lead to a substantial decrease of an elastic modulus resulting in an increase of resistance. Suitable polymer system having a high temperature stability, for example up to 500° C. for polyimides are, for example thermoset plastics such as epoxy compounds or acrylate resins, for example high temperature thermoplastics such as polyphenylene sulfide (PPS), polyether ether ketone (PEEK), polyamide-imide (PAI), polyethersulfone (PES), polysulfone (PSU), polyetherimide (PEI) or liquid crystal polymers (LCP). All of these examples exhibit a melting temperature or glass transition temperature greater than 260° C. being a typical value of a current maximum soldering temperature. Examples of metal particles are silver (Ag) and copper (Cu).

The positive temperature coefficient structure may also be a crystalline or partly crystalline polymer coated with electrically conducting carbon or another conducting material. The crystalline structure allows for a dense layer of carbon particles or particles of another conducting material on the polymer surface enabling for current flow through the conducting carbon layer or through the other conducting material. Heating, for example caused by overcurrents leads to an increase of temperature of the crystalline or partly crystalline polymer. When exceeding a phase transition temperature of the polymer, the crystalline or partly crystalline polymer becomes amorphous. This phase change is accompanied by a slight increase of volume resulting in a separation or partial separation of the conducting coating leading to an increase of resistance. Partial crystalline polymers such as PEEK, PAI or PES having a glass transition temperature Tg of approximately 225° C. may be used. For higher critical temperatures polyimide (PI) having a glass transition temperature in a range of approximately 250° C. and 400° C. may be used. For smaller critical temperatures polysulfone (PSU) having a glass transition temperature Tg of 187° C. may be used.

Figure 2A:
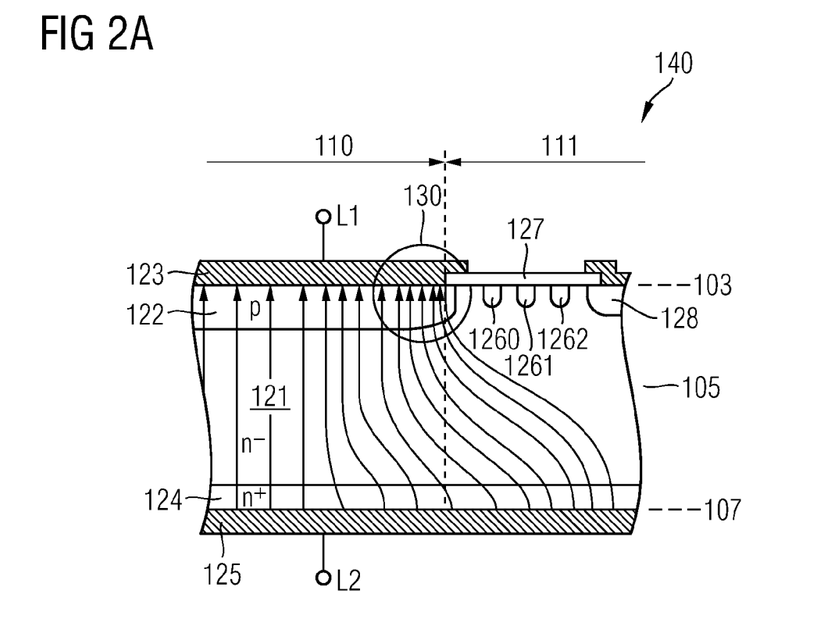
FIG. 2A is a schematic cross-sectional view of a semiconductor diode without the positive temperature coefficient structure.

FIG. 2A is a schematic cross-sectional view of a semiconductor diode 140 without a positive temperature coefficient structure in the edge termination area 111 at the second surface 107. An n$^-$-doped drift zone 121 is part of the semiconductor body 105. A p-doped anode region 122 adjoins the first surface 103 and is electrically connected to the first load terminal L1 via an anode contact 123. An n$^+$-doped cathode region 124 adjoins the second surface 107 and is electrically connected to the second load terminal L2 via a collector contact 125.

The edge termination area 111 includes a planar edge termination with guard rings 1260, 1261, 1262 adjoining a passivation layer 127 at the first surface 103. The edge termination area 111 may also include other planar edge termination structures or mesa termination structures. The edge termination area 111 may further include a channel stopper 128. During an overcurrent event, current crowding in a boundary area 130 of the p-doped anode region 122 is caused by current injection from the n$^+$-doped cathode region 124 in the edge termination area 111. Current crowding in the boundary area 130 is illustrated in a simplified manner in FIG. 2A by current flow lines. The current crowding in the boundary area 130 at the first surface 103 may lead to device failure or device destruction caused by, for example overcurrent.

Figure 2B:
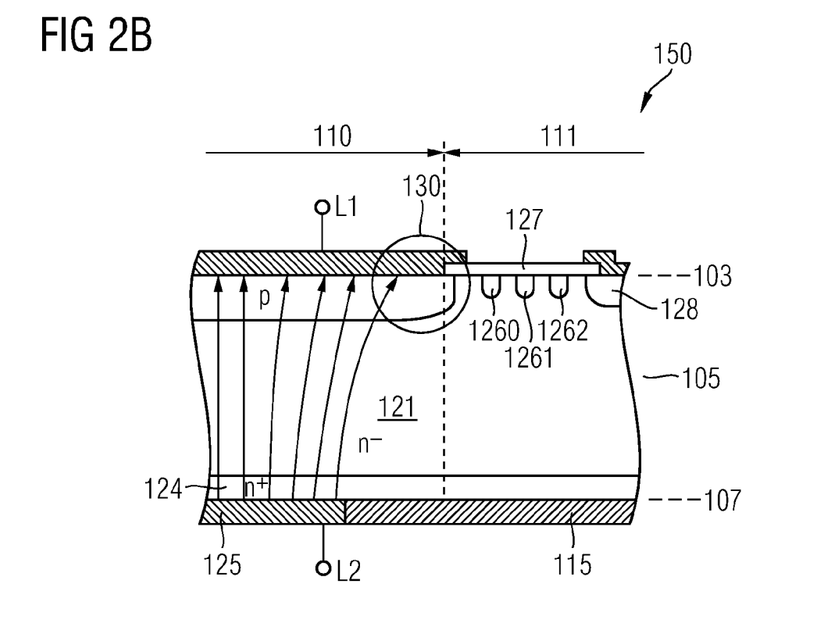
FIGS. 2B to 2D are schematic illustrations of semiconductor devices including the positive temperature coefficient structure and a mesa edge termination or a planar edge termination.

FIG. 2B is a cross-sectional view of an embodiment of a semiconductor diode 150 having, in addition to the elements of the semiconductor diode 140 illustrated in FIG. 2A, the positive temperature coefficient structure 115 at the second surface 107 in the edge termination area 111. A degree of area coverage with the positive temperature coefficient structure 115 is greater in the edge termination area 111 than in the active device area 110. Thermal heating of the positive temperature coefficient structure 115, for example caused by an overcurrent event will lead to a significant increase of resistance of the positive temperature coefficient structure 115 resulting in a decrease or suppression of current injection from the n$^+$-doped cathode region 124 in the edge termination area 111. This allows for avoiding or reducing current crowding in the boundary area 130 of the p-doped anode region 122 at the first surface 103. Thus, a probability of device failure, device degradation or device destruction caused by current crowding in the boundary area 130 due to overcurrent can be reduced. Thus, the positive temperature coefficient structure 115 allows for an improvement in overcurrent strength.

Figure 2C:
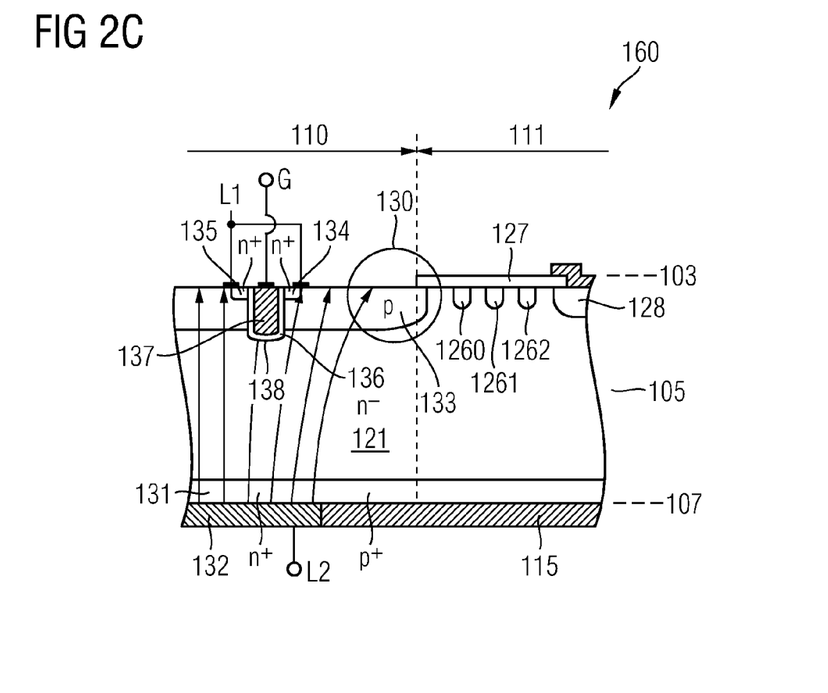

FIG. 2C is a cross-sectional view of an IGBT 160 including the positive temperature coefficient structure 115 in the edge termination area 111 at the second surface 107. The IGBT 160 further includes a p$^+$-doped collector injection structure 131 adjoining the second surface 107. The positive temperature coefficient structure 115 and a collector contact 132 are electrically connected to the second load terminal L2. A p-doped body region 133 and an n$^+$-doped source region 134 adjoin the first surface 103 and are electrically connected to the first load terminal L1 via an emitter contact 135. A gate dielectric 136 and a gate electrode 137 are formed in a trench 138. The gate electrode 137 is electrically connected to a gate terminal G.

Similar to the semiconductor diode 150 illustrated in FIG. 2B, the positive temperature coefficient structure 115 in the edge termination area 111 of the IGBT 160 allows for avoiding or decreasing the risk of current crowding in the boundary area 130 of the p-doped body region 133 due to excessive current injection from the collector injection structure 131 in the edge termination area 111.

Figure 2D:
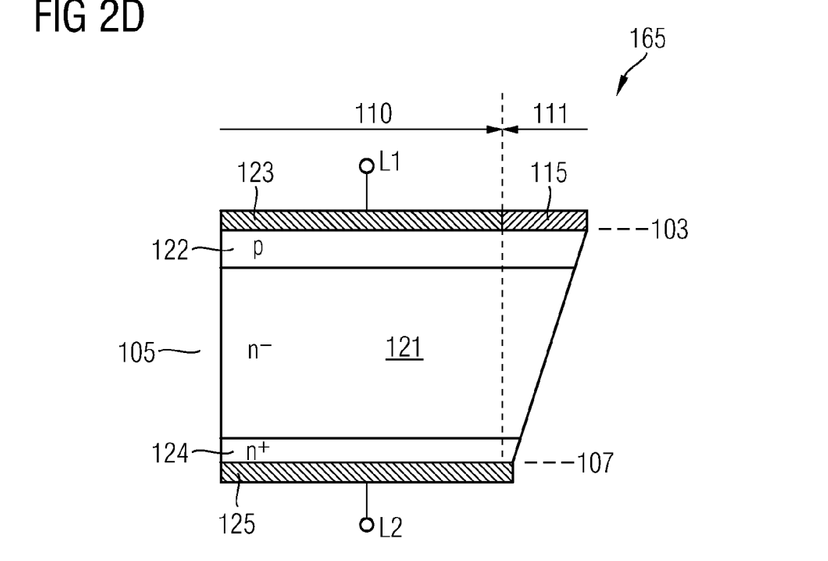

FIG. 2D is a cross-sectional view of a semiconductor diode 165 including the positive temperature coefficient structure 115 in the edge termination area 111 at the first surface 103. Other than the embodiments illustrated in FIGS. 2A to 2C exhibiting planar edge terminations, the semiconductor diode 155 includes a mesa edge termination in the form of a positive bevel edge termination structure. The technical benefits achieved by the positive temperature coefficient structure 115 in the edge termination area 111 are similar to the benefits described above with respect to FIGS. 2B and 2C.

Figure 3A:
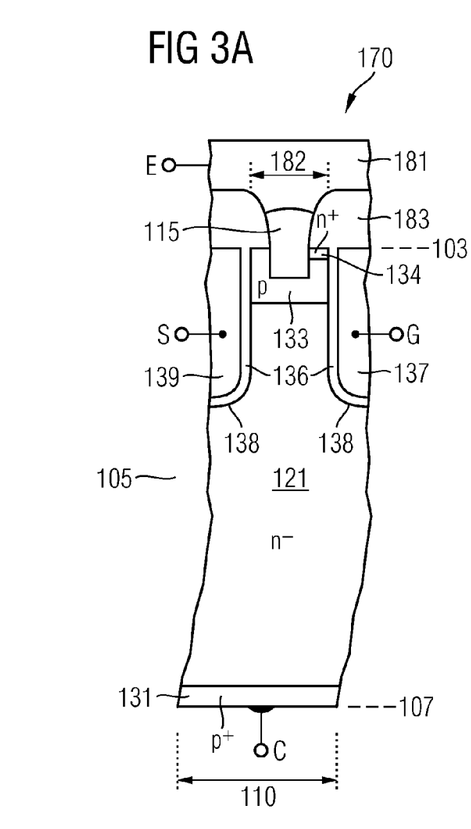
FIGS. 3A to 3C are cross-sectional views of embodiments of insulated gate bipolar transistors including the positive temperature coefficient structure as part of an emitter contact structure.
Figure 3B:
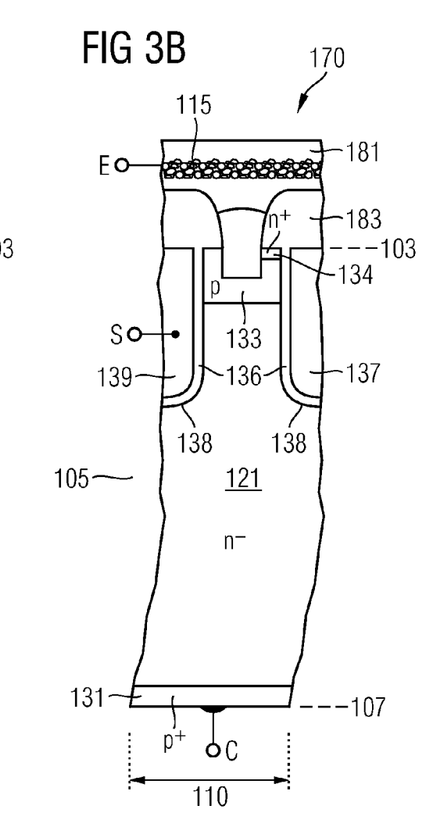
Figure 3C:
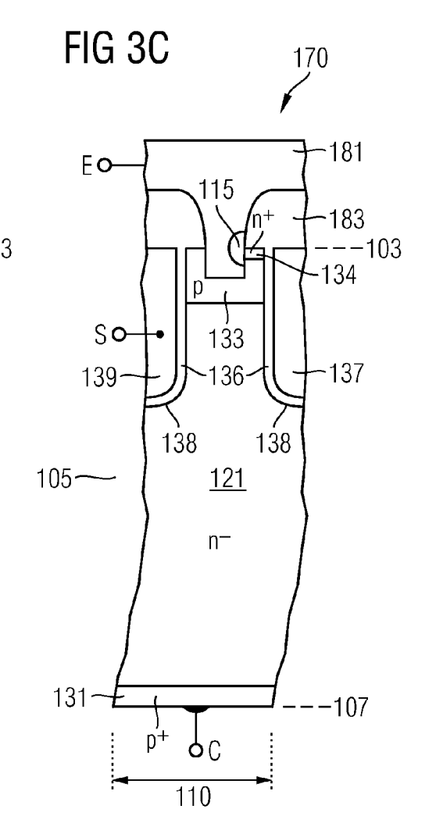

The schematic cross-sectional views of FIGS. 3A to 3C illustrate embodiments of an insulated gate bipolar transistor 170. The IGBT 170 comprises an emitter terminal E at the first surface 103 of the semiconductor body 105. A collector terminal C is at the second surface 107 of the semiconductor body 105. A drift zone 121 of a first conductivity type, for example n-type is in the semiconductor body 105 between the first and second surfaces 103, 107. A collector injection structure 131 is between the drift zone 121 and the second surface 107 in a transistor cell area. A positive temperature coefficient structure 115 is part of an emitter contact structure 181 at the first surface 103.

In the IGBT 170, the gate electrode 137 is electrically coupled to a gate terminal G and a further electrode 139 is electrically coupled to a source terminal S.

In the embodiment of the IGBT 170 illustrated in FIG. 3A, the positive temperature coefficient structure 115 is part of a filling of a contact opening 182 in a dielectric layer 183 adjoining at the first surface 103. According to an embodiment, a barrier layer may be arranged between the semiconductor body 105 and the positive temperature coefficient structure 115.

In the embodiment of the IGBT 170 illustrated in FIG. 3B, the positive temperature coefficient structure 115 is part of a porous region of the emitter contact structure 181. A thermal and electrical conductivity of the emitter contact structure 181 above a critical temperature may be adjusted by a degree of porosity. A foamy distribution of the positive temperature coefficient structure 115 may secure a fast and complete phase change of the positive temperature coefficient structure above the critical temperature.

In the embodiment of the IGBT 170 illustrated in FIG. 3C, the positive temperature coefficient structure 115 abuts the source region 134, and another part of the filling different from the positive temperature coefficient structure 115 abuts the body region 133 of the IGBT 170. An additional voltage drop caused by a temperature dependent change of resistance of the positive temperature coefficient structure 115 is limited to the source region 134. This allows for a further reduction of a saturation current caused by current constriction between an n-type channel and the p-doped body region 133 similar to a junction field effect transistor (JFET). Moreover, latch-up effects during overcurrent turn-off of an excessively heated device may be reduced.

Apart from a short circuit function, the embodiments allow for protecting a parallel connection of circuit devices such as transistor cells against overheating. Apart from lowering saturation currents in short-circuit mode, the embodiments of FIGS. 3A to 3C lead to an increase of an emitter to collector voltage of cells exceeding a critical temperature. As a consequence, current flow will be decreased in the overheated cells and increased in those cells not exceeding the critical temperature. This allows for avoiding early damage of weak device parts, for example caused by solder or cooling flaws caused by operation in overload.

The transistor cells of FIGS. 3A to 3C may be evenly distributed within the active device area 110 of an IGBT device, or may constitute the sole active cells of the IGBT device, or may be intermixed with additional further transistor cells without the positive temperature coefficient structure 115. The total ratio of cells of FIGS. 3A-C and second transistor cells may vary over the device, e.g., being higher near an edge termination area 111 than in a central region of the active device area 110.

The schematic cross-sectional views of FIGS. 4A to 4D illustrate embodiments of an insulated gate bipolar transistor 170. The IGBT 190 comprises the collector terminal C at the second surface 107 of the semiconductor body 105. The active device area 110 is surrounded by the edge termination area 111. The positive temperature coefficient structure 115 is between the collector terminal C and the collector injection structure 131 at the second surface 107. The positive temperature coefficient structure 115 at least partly covers the active device area 110 at the second surface 107.

In normal operation mode, for example at operation temperatures smaller than 175° C., the positive temperature coefficient structure 115 in the active device area 110 has a small resistance. Thus, hole injection from the collector injection structure 131 into the semiconductor body 105 is unhindered. During short-circuit or other extreme conditions, high temperatures occur, for example temperatures above 175° C. and the positive temperature coefficient structure 115 active device area 110 becomes high resistive. This hinders hole injection from those parts of the collector injection structure 131 that are covered with the positive temperature coefficient structure 115. As a result, the saturation current is lowered preventing destructive or damaging overcurrent in the device. Dimensions and distances between different parts of the positive temperature coefficient structure 115 may be chosen so as to avoid overheating/melting by high currents in the area between the parts during short-circuit while achieving a sufficient reduction of hole injection.

According to an embodiment, a degree of area coverage of the positive temperature coefficient structure in the active device area is greater than 50%.

Figure 4A:
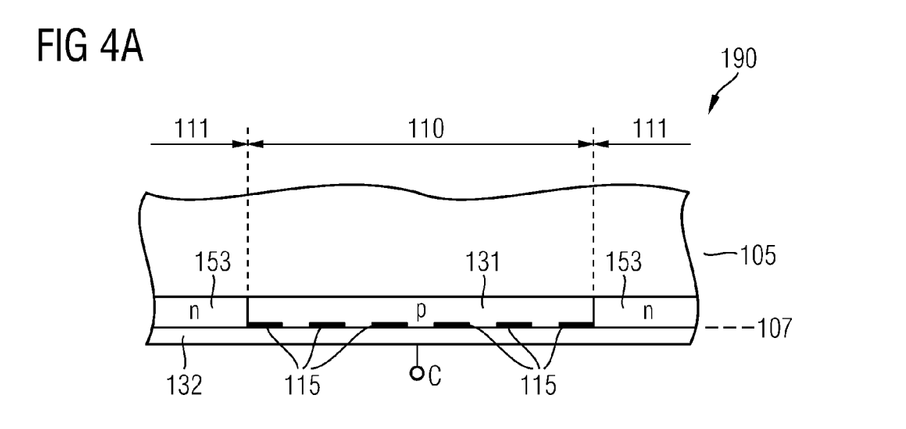
FIGS. 4A to 4D are cross-sectional views of embodiments of insulated gate bipolar transistors including the positive temperature coefficient structure between a collector terminal and a collector injection structure in an active device area.
Figure 4B:
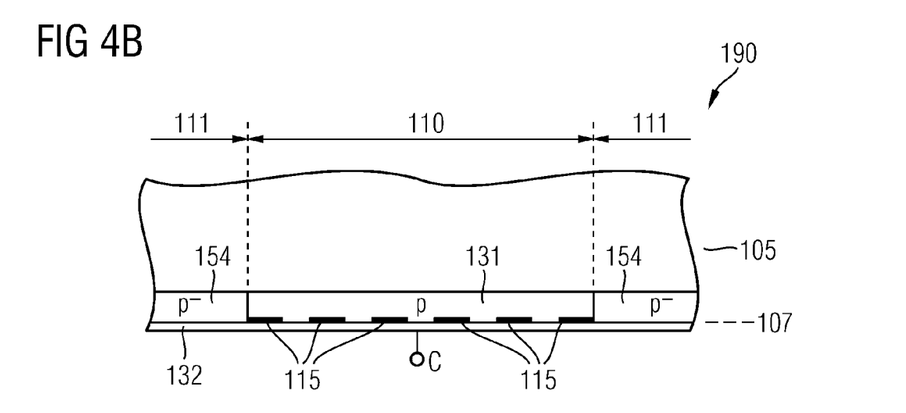
Figure 4C:
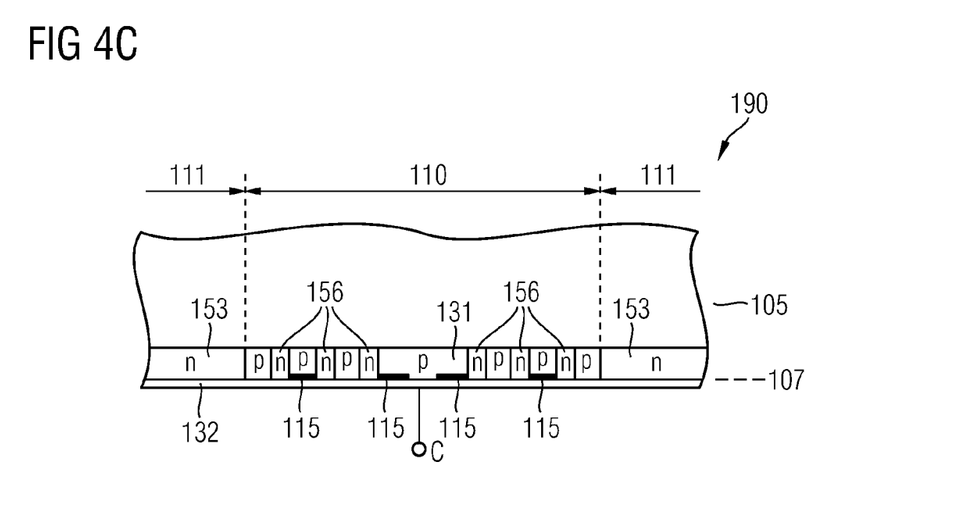
Figure 4D:
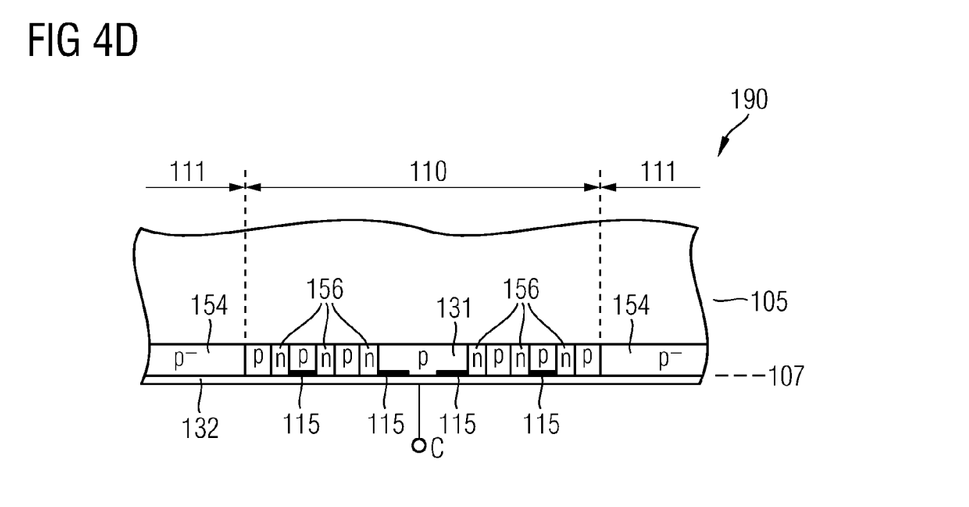

Other than the IGBTs illustrated in FIGS. 4A and 4B, the IGBTs 170 illustrated in FIGS. 4C and 4D are reverse conducting (RC) IGBTs including n-doped short regions 156 abutting the collector contact between parts of the positive temperature coefficient structure 115.

In the embodiments illustrated in FIGS. 4B and 4D, a conductivity type of the doped region 153 equals the conductivity type of the collector injection structure 131, whereas a conductivity type of the doped region 154 illustrated in FIGS. 4A and 4C differs from the conductivity type of the collector injection structure 131. The doped regions 153, 154 allow for a high dynamic robustness (HDR).

Highly doped contact regions may be arranged between the n-doped short regions 115 and the collector contact 132 for lowering a contact resistance, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first load terminal at a first surface of a semiconductor body;
   a second load terminal at a second surface of the semiconductor body opposite to the first surface;
   an active device area surrounded by an edge termination area, wherein load terminal contacts are electrically connected to the semiconductor body in the active device area at the first surface; and
   a positive temperature coefficient structure between at least one of the first and second load terminals and a corresponding one of the first and second surfaces,
   wherein a degree of area coverage with the positive temperature coefficient structure is greater in the edge termination than in the active device area,
   and wherein above a maximum operation temperature specified for the semiconductor device, a specific resistance of the positive temperature coefficient structure increases by at least two orders of magnitude within a temperature range of at most 50 K.

2. The semiconductor device of claim 1, wherein the degree of coverage of the positive temperature coefficient structure in the edge termination area is greater than 50%.

3. The semiconductor device of claim 1, wherein the degree of coverage of the positive temperature coefficient structure in the active device area is smaller than 50%.

4. The semiconductor device of claim 1, wherein the positive temperature coefficient structure is in direct contact with the semiconductor body.

5. The semiconductor device of claim 1, wherein the positive temperature coefficient structure is in the edge termination area between the second load terminal and the second surface.

6. The semiconductor device of claim 1, wherein the edge termination area includes a planar edge termination structure.

7. The semiconductor device of claim 1, wherein the edge termination area includes a mesa edge termination structure.

8. The semiconductor device of claim 1, wherein the edge termination area comprises a positive bevel edge termination structure, and wherein the positive temperature coefficient structure is arranged at the first surface.

9. The semiconductor device of claim 1, wherein the edge termination area comprises a negative bevel edge termination structure, and wherein the positive temperature coefficient structure is arranged at the second surface.

10. The semiconductor device of claim 1, wherein the semiconductor device is a diode including an anode region in the active device area at the first surface and a cathode region at the second surface, and wherein the first load terminal is electrically connected to the anode region and the second load terminal is electrically connected to the cathode region.

11. The semiconductor device of claim 1, wherein the semiconductor device is an insulated gate bipolar transistor including an emitter at the first surface and a collector at the second surface, and wherein the first load terminal is electrically connected to the emitter and the second load terminal is electrically connected to the collector.

12. An insulated gate bipolar transistor, comprising:
an emitter terminal at a first surface of a semiconductor body;
a collector terminal at a second surface of the semiconductor body;
a drift zone of a first conductivity type in the semiconductor body between the first and second surfaces;
a collector injection structure between the drift zone and the second surface in a transistor cell area; and
a positive temperature coefficient structure which is part of an emitter contact structure at the first surface, wherein above a maximum operation temperature specified for the semiconductor device a specific resistance of the positive temperature coefficient structure increases by at least two orders of magnitude within a temperature range of at most 50 K.

13. The insulated gate bipolar transistor of claim 12, wherein the positive temperature coefficient structure is part of a filling of a contact opening in a dielectric layer adjoining at the first surface.

14. The insulated gate bipolar transistor of claim 13, wherein the positive temperature coefficient structure abuts a source region of the insulated gate bipolar transistor, and another part of the filling different from the positive temperature coefficient structure abuts a body region of the insulated gate bipolar transistor.

15. The insulated gate bipolar transistor of claim 12, wherein the positive temperature coefficient structure is embedded in a porous part of a metallization layer electrically coupling the semiconductor body and the first load terminal.

16. An insulated gate bipolar transistor, comprising:
an emitter terminal at a first surface of a semiconductor body;
a collector terminal at a second surface of the semiconductor body;
an active device area surrounded by an edge termination area, wherein emitter contacts are electrically connected to the semiconductor body in the active device area at the first surface; and
a positive temperature coefficient structure between the collector terminal and a collector injection structure at the second surface, wherein the positive temperature coefficient structure at least partly covers the active device area at the second surface, and wherein above a maximum operation temperature specified for the semiconductor device a specific resistance of the positive temperature coefficient structure increases by at least two orders of magnitude within a temperature range of at most 50 K.

17. The insulated gate bipolar transistor of claim 16, wherein a degree of area coverage of the positive temperature coefficient structure in the active device area is greater than 50%.

18. The insulated gate bipolar transistor of claim 16, further comprising a doped region adjoining the second surface in the edge termination area surrounding the active device area, wherein a dose of doping of the doped region is smaller than a dose of doping of the collector injection structure.

19. The insulated gate bipolar transistor of claim 16, wherein the insulated gate bipolar transistor is a reverse conducting insulated gate bipolar transistor including short regions electrically connected to a collector contact at the second surface, the short regions having a conductivity type different from the conductivity type of the collector injection structure.

20. The insulated gate bipolar transistor of claim 16, wherein the positive temperature coefficient structure includes a material of at least one of a phase change or phase transition material having a critical temperature of a phase change between a crystalline phase and an amorphous phase of greater than 175° C., a semiconducting, polycrystalline ceramic, polymer matrix-metal particles composites, a polymer coated with carbon or with electrically conductive particles.

* * * * *